(12) United States Patent
Togawa et al.

(10) Patent No.: US 6,428,400 B1
(45) Date of Patent: Aug. 6, 2002

(54) DRAINAGE STRUCTURE IN POLISHING PLANT

(75) Inventors: Tetsuji Togawa; Kuniaki Yamaguchi, both of Kanagawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/612,939

(22) Filed: Jul. 10, 2000

Related U.S. Application Data

(63) Continuation of application No. 08/969,738, filed on Nov. 13, 1997, now abandoned.

(30) Foreign Application Priority Data

Nov. 14, 1996 (JP) .............................. 8-321077

(51) Int. Cl.$^7$ .............................. B24B 9/00; B24B 7/00
(52) U.S. Cl. .......................... 451/67; 451/87; 451/453; 451/287; 451/446
(58) Field of Search .............................. 451/65, 67, 87, 451/88, 442, 41, 453, 446, 286, 287, 288, 289, 290

(56) References Cited

U.S. PATENT DOCUMENTS

| | | | |
|---|---|---|---|
| 4,193,226 A | | 3/1980 | Gill, Jr. et al. |
| 4,920,700 A | | 5/1990 | Murahashi et al. |
| 5,113,622 A | | 5/1992 | Nishiguchi et al. |
| 5,299,584 A | | 4/1994 | Miyazaki et al. |
| 5,545,074 A | * | 8/1996 | Jacobs .......................... 451/40 |
| 5,584,959 A | | 12/1996 | Kimura et al. |
| 5,595,529 A | | 1/1997 | Cesna et al. |
| 5,651,725 A | * | 7/1997 | Kibuta et al. .................. 451/41 |
| 5,679,055 A | | 10/1997 | Greene et al. |
| 5,755,614 A | * | 5/1998 | Adams et al. ................. 451/60 |
| 5,779,520 A | | 7/1998 | Hayakawa |
| 5,800,254 A | | 9/1998 | Motley et al. |
| 6,190,236 B1 | * | 2/2001 | Drill ............................ 451/41 |

FOREIGN PATENT DOCUMENTS

| | | |
|---|---|---|
| EP | 0639534 A2 | 2/1995 |
| JP | 7-108458 | 4/1995 |
| JP | 9-262767 | 10/1997 |
| JP | 9-320997 | 12/1997 |

OTHER PUBLICATIONS

Patent Abstracts of Japan, vol. 096, No. 11, Nov. 29, 1996 & JP 08 187660 A (Ebara Corporation), Jul. 23, 1996.

U.S. patent application, Ser. No. 08/845,423, filed Apr. 25, 1997, entitled "Polishing Apparatus", by Tetsuji Togawa et al., located in Group Art Unit 3203.

U.S. patent application, Ser. No. 08/787,916, filed Jan. 23, 1997, entitled "Polishing Apparatus", by Tetsuji Togawa et al., located in Group Art unit 1104.

* cited by examiner

*Primary Examiner*—Timothy V. Eley
(74) *Attorney, Agent, or Firm*—Wenderoth, Lind & Ponack, L.L.P.

(57) ABSTRACT

A polishing plant including a polishing apparatus having a top ring for holding a workpiece and a turn table for polishing a surface of the workpiece held by the top ring. A cleaning apparatus has cleaning machines for cleaning the workpiece polished by the polishing apparatus. At least one drainage pipe connected to the polishing apparatus discharges a waste liquid from the polishing apparatus, and at least one drainage pipe connected to the cleaning apparatus discharges a waste liquid from the cleaning apparatus are provided as separate plural drainage pipe lines, depending on the type of waste liquid. By use of the polishing plant of the present invention, treatment of waste liquids can be efficiently conducted.

8 Claims, 3 Drawing Sheets

DRAINAGE STRUCTURE IN POLISHING PLANT

This is a Continuation Application of parent Ser. No. 08/969,738 filed Nov. 13, 1997, which is now abandoned.

BACKGROUND OF THE INVENTION

The present invention relates to a drainage structure in a polishing plant.

In the manufacture of semiconductor wafers, a polishing apparatus has been used for polishing a semiconductor wafer so as to enable a surface of the semiconductor wafer to be made flat with a mirror-surface finish. Generally, a polishing apparatus is used in combination with a cleaning apparatus for cleaning and drying semiconductor wafers after polishing. In a conventional polishing plant comprising a polishing apparatus and a cleaning apparatus, a number of drainage pipes are employed to discharge various liquids which have been used in various devices in the polishing and cleaning apparatuses, and these drainage pipes are connected to a single pipe. Therefore, in the above-mentioned conventional polishing plant, the liquids which have been used in various devices in the polishing and cleaning apparatuses are individually discharged as waste liquids through the drainage pipes from those devices, collected into the single pipe, and finally discharged from the polishing plant through a single drainage pipe line.

In the above-mentioned conventional polishing plant in which various waste liquids are finally discharged from the polishing plant through a single drainage pipe line, it is impossible to perform different treatments of waste liquids depending on the type of waste liquid to be treated (e.g., depending on the concentration of impurities and the type of chemicals). The waste liquids finally discharged from the polishing plant are supplied to a solid matter-treating apparatus, in which solid matter in the waste liquids is removed, and are transferred to a factory drainage line as an industrial waste liquid.

Therefore, in a conventional polishing plant, even a waste liquid which is not seriously contaminated or does not contain solid matter is subjected to the same treatment as performed with respect to a waste liquid which is seriously contaminated or contains solid matter, so that not only does a waste liquid-treating plant inevitably become large, but costs of operation for treating waste liquids also become high. Further, in a conventional polishing plant, it is impossible to reuse a reusable waste liquid which is not seriously contaminated, because various types of waste liquids are mixed with the reusable waste liquid. In addition, there is a danger such that a chemical reaction may occur when various chemicals used in the polishing and cleaning apparatuses are mixed.

SUMMARY OF THE INVENTION

In view of the above-mentioned situations, the present invention has been made. It is a primary object of the present invention to provide a drainage structure in a polishing plant, by use of which a waste liquid treatment can be efficiently conducted.

According to the present invention, there is provided a polishing plant comprising a polishing apparatus having a top ring for holding a workpiece and a turn table for polishing a surface of the workpiece held by the top ring. A cleaning apparatus has cleaning machines for cleaning the workpiece polished by the polishing apparatus. At least one drainage pipe connected to the polishing apparatus to discharge a waste liquid (or water) from the polishing apparatus and at least one drainage pipe connected to the cleaning apparatus to discharge a waste liquid (or water) from the cleaning apparatus are provided separately or divided into a plurality of drainage pipe lines, depending on the type of waste liquid.

Preferably, the at least one drainage pipe connected to the polishing apparatus and the at least one drainage pipe connected to the cleaning apparatus are divided into a plurality of drainage pipe lines, depending on the degree of contamination of the waste liquid, and with respect to waste liquids discharged through the plurality of drainage pipe lines, the waste liquid exhibiting a low degree of contamination is reused as a liquid supplied to a device from which a waste liquid exhibiting a high degree of contamination is discharged.

The foregoing and other objects, features and advantages of the present invention will be apparent from the following detailed description and appended claims taken in connection with the accompanying drawings.

DETAILED DESCRIPTION OF THE PREFERRED EMBODIMENTS

Hereinbelow, an embodiments of the present invention are described in detail, with reference to the accompanying drawings.

Figure 2:
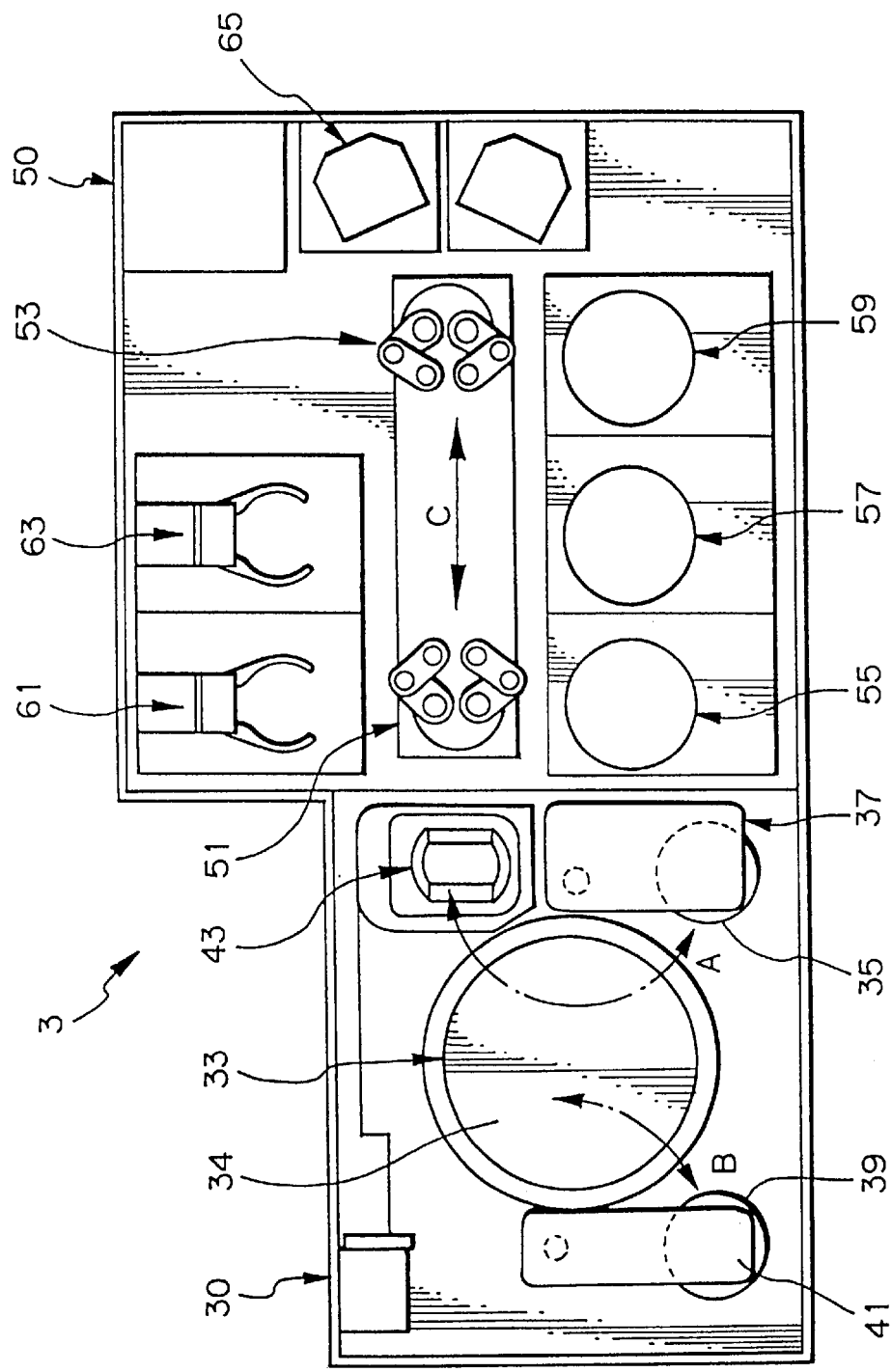
FIG. 2 is a schematic plan view showing an internal structure of a polishing plant comprising a polishing apparatus and a cleaning apparatus according to the present invention.

First, description is made on a general construction of a polishing plant comprising a polishing apparatus and a cleaning apparatus. FIG. 2 is a schematic plan view showing an internal structure of a polishing plant 3 comprising a polishing apparatus 30 and a cleaning apparatus 50 according to the present invention.

As shown in FIG. 2, the polishing apparatus 30 comprises: a turn table 33 provided in the center of the polishing apparatus 30; a polishing unit 37 having a top ring 35 provided at one side of the turn table 33; a dressing unit 41 having a dressing tool 39 provided at the other side of the turn table 33; and a work-transferring device 43. The cleaning apparatus 50 comprises: two central conveying robots 51 and 53 shiftable in directions shown by a double-headed arrow C; a first cleaning machine 55, a second cleaning machine 57 and a spin drier 59 having a cleaning ability (the spin drier 59 may not have a cleaning ability in the present invention), all of which are disposed side by side at one side of the conveying robots 51 and 53; and two work turning-over machines 61 and 63 which are disposed side by side at the other side of the conveying robots 51 and 53.

In the polishing plant 3 arranged as mentioned above, for example, when a cassette 65 in which semiconductor wafers before polishing are contained is set at a position shown in FIG. 2, the conveying robot 53 takes out one semiconductor wafer from the cassette 65 and conveys the wafer to the work turning-over machine 63, where the wafer is turned over. Then, the wafer is transferred from the work turning-over machine 63 to the conveying robot 51, and the conveying robot 51 conveys the wafer to the work-transferring device 43.

The wafer is transferred from the work-transferring device 43 onto the turn table 33 as indicated by an arrow A while being held by a lower surface of the top ring 35 of the polishing unit 37, and is polished by a polishing surface 34 of the turn table 33 which is rotating. In this instance, an abrasive liquid is supplied from a supply pipe 24 (shown in FIG. 1) to the polishing surface 34.

After polishing, the wafer is returned to the work-transferring device 43 and conveyed to the work turning-over machine 61 by the conveying robot 51. In the work turning-over machine 61, the wafer is turned over while being rinsed with purified water. Subsequently, the wafer is washed with chemicals and purified water in the first cleaning machine 55 and the second cleaning machine 57. The resultant wafer is cleaned and then spin-dried in the spin drier 59 having a cleaning ability. Then, the wafer is returned to the cassette 65 by the conveying robot 53.

With respect to the dressing unit 41, it is appropriately moved onto the turn table 33 as indicated by an arrow B. The dressing tool 39 which is rotating is pressed against the polishing surface 34 of the turn table 33 which is also rotating, so that the polishing surface 34 is refreshed and conditioned. In this instance, purified water is supplied from a supply pipe 25 (shown in FIG. 1) to the polishing surface 34.

Figure 1:
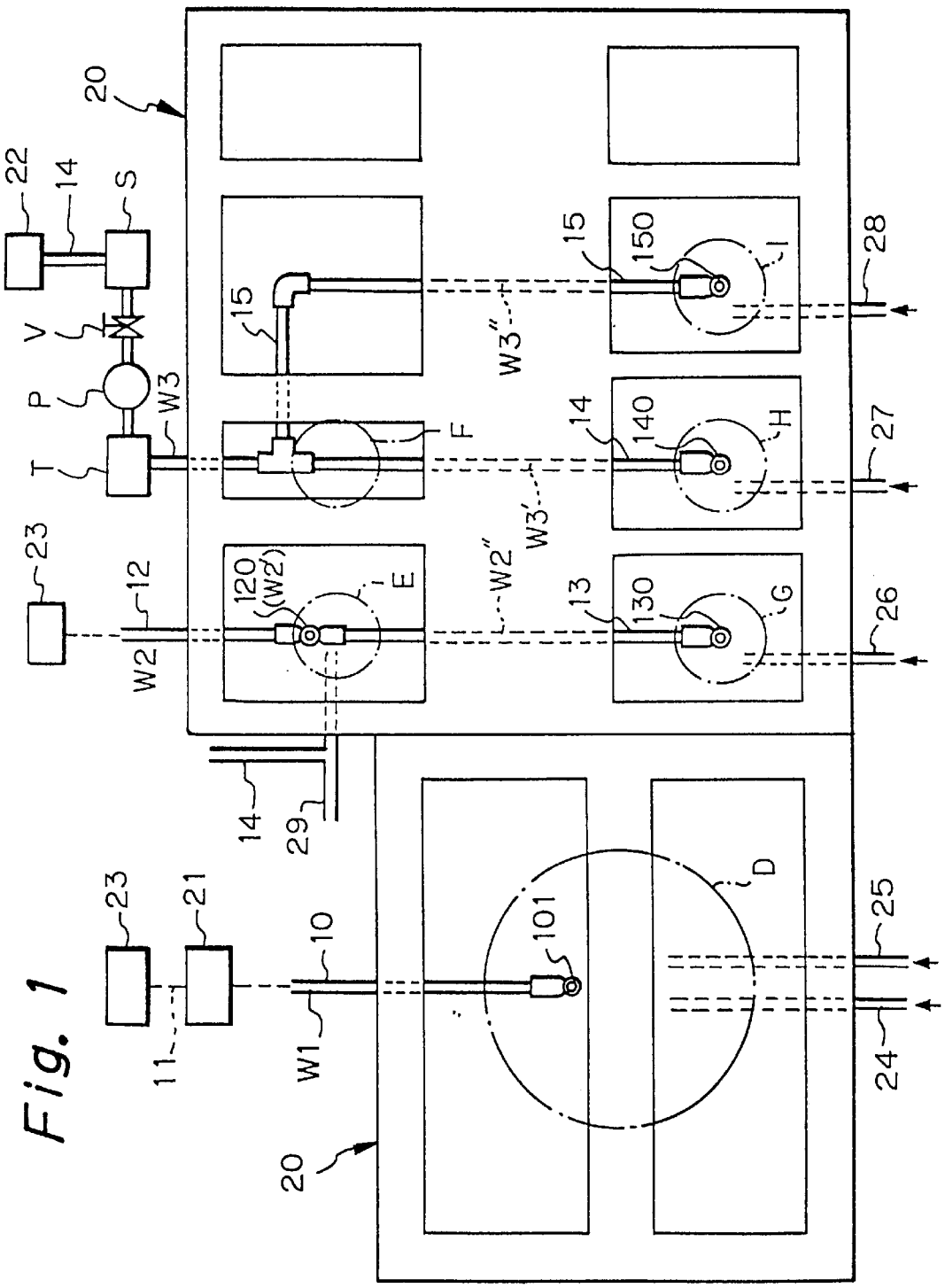
FIG. 1 is a plan view showing a base and drainage pipes provided in parts of the base.

FIG. 1 is a plan view showing a base 20 on which various devices in the polishing apparatus 30 and the cleaning apparatus 50 are provided and also showing drainage pipes, etc. which are provided in parts of the base 20.

As shown in FIG. 1, the base 20 as a whole is arranged in planar form by assembling a number of steel materials, each having a cross-section in the form of an inverted C (or in an I form or a generally square form). Various devices shown in FIG. 2 are provided on the base 20. The turn table 33, the work turning-over machine 61, the work turning-over machine 63, the first cleaning machine 55, the second cleaning machine 57 and the spin drier 59 having a cleaning ability (a third cleaning machine) are provided in a part D, a part E, a part F, a part G, a part H and a part I of the base 20, respectively. Abrasive liquid and purified water are supplied to the part D through the supply pipe 24 and the supply pipe 25, respectively, and a first cleaning liquid, a second cleaning liquid and a third cleaning liquid are supplied to the part G, the part H and the part I through a supply pipe 26, a supply pipe 27 and a supply pipe 28, respectively. Further, a cleaning liquid, such as purified water, is supplied to the part E through a supply pipe 29. Each of the liquids supplied to the supply pipes 24 to 29 may be a liquid which has not yet been used.

A waste liquid W1 containing the abrasive liquid and the purified water for dressing which have been used on the turn table 33 is discharged to the outside from a drainage pipe 10 connected to a pipe connector 101 in a lower surface of the turn table 33.

A liquid which has been used in the work turning-over machine 61 is discharged as a waste liquid W2' from a drainage pipe 12 connected to a pipe connector 120 in a lower surface of the work turning-over machine 61. A liquid which has been used in the first cleaning machine 55 is discharged as a waste liquid W2" from a drainage pipe 13 connected to a pipe connector 130 in a lower surface of the first cleaning machine 55. The drainage pipe 13 is connected to the drainage pipe 12. Thus, a mixture of the waste liquid W2' and the waste liquid W2" is discharged as a waste liquid W2 from the drainage pipe 12 to the outside.

A liquid which has been used in the second cleaning machine 57 is discharged as a waste liquid W3' from a drainage pipe 14 connected to a pipe connector 140 in a lower surface of the second cleaning machine 57. A liquid which has been used in the spin drier 59 having a cleaning ability is discharged as a waste liquid W3" from a drainage pipe 15 connected to a pipe connector 150 in a lower surface of the spin drier 59 having a cleaning ability. The drainage pipe 15 is connected to the drainage pipe 14. Thus, a mixture of the waste liquid W3' and the waste liquid W3" is discharged as a waste liquid W3 from the drainage pipe 14 to the outside.

That is, in the above-mentioned embodiment of the present invention, a drainage pipe line for discharging a liquid which has been used in the polishing apparatus 30, a drainage pipe line for discharging both a liquid which has been used in the work turning-over machine 61 and a liquid which has been used in the first cleaning machine 55 in the cleaning apparatus 50, and a drainage pipe line for discharging both a liquid which has been used in the second cleaning machine 57 and a liquid which has been used in the spin drier 59 having a cleaning ability in the cleaning apparatus 50 are provided as separate drainage pipe lines.

Further, in this embodiment, the drainage pipe 10 is connected to a solid matter-treating apparatus 21 for separating solid matter from the waste liquid W1, which apparatus is connected to a factory drainage line 11. The factory drainage line 11 is connected to a waste liquid-treating plant 23 in the factory. Thus, the waste liquid W1 is treated, together with industrial waste liquids discharged from various sites in the factory.

The drainage pipe 12 is connected to the waste liquid-treating plant 23 directly or through the factory drainage pipe line 11.

Further, the drainage pipe 14 is connected to a waste liquid-reusing apparatus 22, for example, the supply pipe 29 for the work turning-over machine 61, through a waste liquid tank T, a pump P, a flow control valve V and a filter S for removal of particles. In case that it is desired to reuse the waste liquid as a higly pure liquid, an ion-exchange separation device is arranged between the pump P and the filter S so that ionic impurities in the waste liquid are removed.

The waste liquid W1 discharged from the polishing apparatus 30, in which semiconductor wafers are polished utilizing an abrasive liquid, has a high concentration of impurities due to a large amount of solid matter. By the above-mentioned arrangement of the present invention, the waste liquid W1 having a high concentration of impurities is transferred through the drainage pipe 10 to the solid matter-treating apparatus 21 where separation of solid matter is effected, and is treated as an industrial waste liquid in the waste liquid-treating plant 23 in the factory.

The waste liquid, from which solid matter contained in the abrasive liquid is removed to some extent in the polishing apparatus 30 and of which the concentration of impurities is still relatively high although separation of solid matter therefrom is not necessary, is transferred to the waste liquid-treating plant 23 directly as an industrial waste liquid, and is treated.

The waste liquid W3 obtained by cleaning the wafers in the second cleaning machine 57 and the spin drier 59 having a cleaning ability has a low concentration of impurities. In this embodiment, the drainage pipe 14 is connected to the supply pipe 29 for the work turning-over machine 61, so that the waste liquid W3 is mixed with the cleaning liquid, such as purified water, supplied from the supply pipe 29 to the work turning-over machine 61, and is reused as a rinse liquid for the wafer in the work turning-over machine 61. However, although not shown in the drawings, the drainage pipe 14 may not be connected to the supply pipe 29, but may be connected to the work turning-over machine 61 directly. The waste liquid W3, which has a low concentration of impurities, is not necessarily mixed with purified water. The waste liquid W3 may be used alone as a rinse liquid, and purified water may be used as a supplemental rinse liquid when the amount of the waste liquid W3 is insufficient for reusing.

In the above-mentioned embodiment of the present invention, waste liquids are separately collected, depending on the concentration of impurities, so that a treatment of each of the waste liquids can be efficiently conducted. Further, a waste liquid having a relatively low concentration of impurities which has been collected in one cleaning step can be reused in a previous cleaning step, leading to a lowering of costs. Generally, in the present invention, a waste liquid supplied from the drainage pipe 14 is reused alone and when the waste liquid tank T becomes almost empty, liquids which have not yet been used may be supplied from the supply pipes 25, 26, 27 and 29 to the turn table 33, the first cleaning machine 55, the second cleaning machine 57 and the work turning-over machine 61.

In this embodiment, the waste liquid W3 from the drainage pipe 14, which has a low concentration of impurities, is reused. However, in the present invention, the waste liquid W3 may be discharged directly as an industrial waste liquid without being reused. Alternatively, a part of the waste liquid W3 from the drainage pipe 14 may be reused and the remaining part of the waste liquid W3 may be discharged as an industrial waste liquid.

Further, in this embodiment, the drainage pipe lines for discharging waste liquids are provided separately on the concentration of impurities in the waste liquid (a degree of contamination of the waste liquid). However, in the present invention, the drainage pipe lines may be divided or provided separately, depending on, for example, the type of chemicals in the waste liquid.

As has been described above, according to the present invention, a plurality of drainage pipes connected to the polishing apparatus and the cleaning apparatus are divided or provided separately into a plurality of drainage pipe lines, depending on the type of waste liquid, so that a treatment of each of different types of waste liquids can be efficiently conducted. Further, in the present invention, it is possible to reuse the waste liquid, so that costs of operation for treating waste liquids can be lowered.

Figure 3:
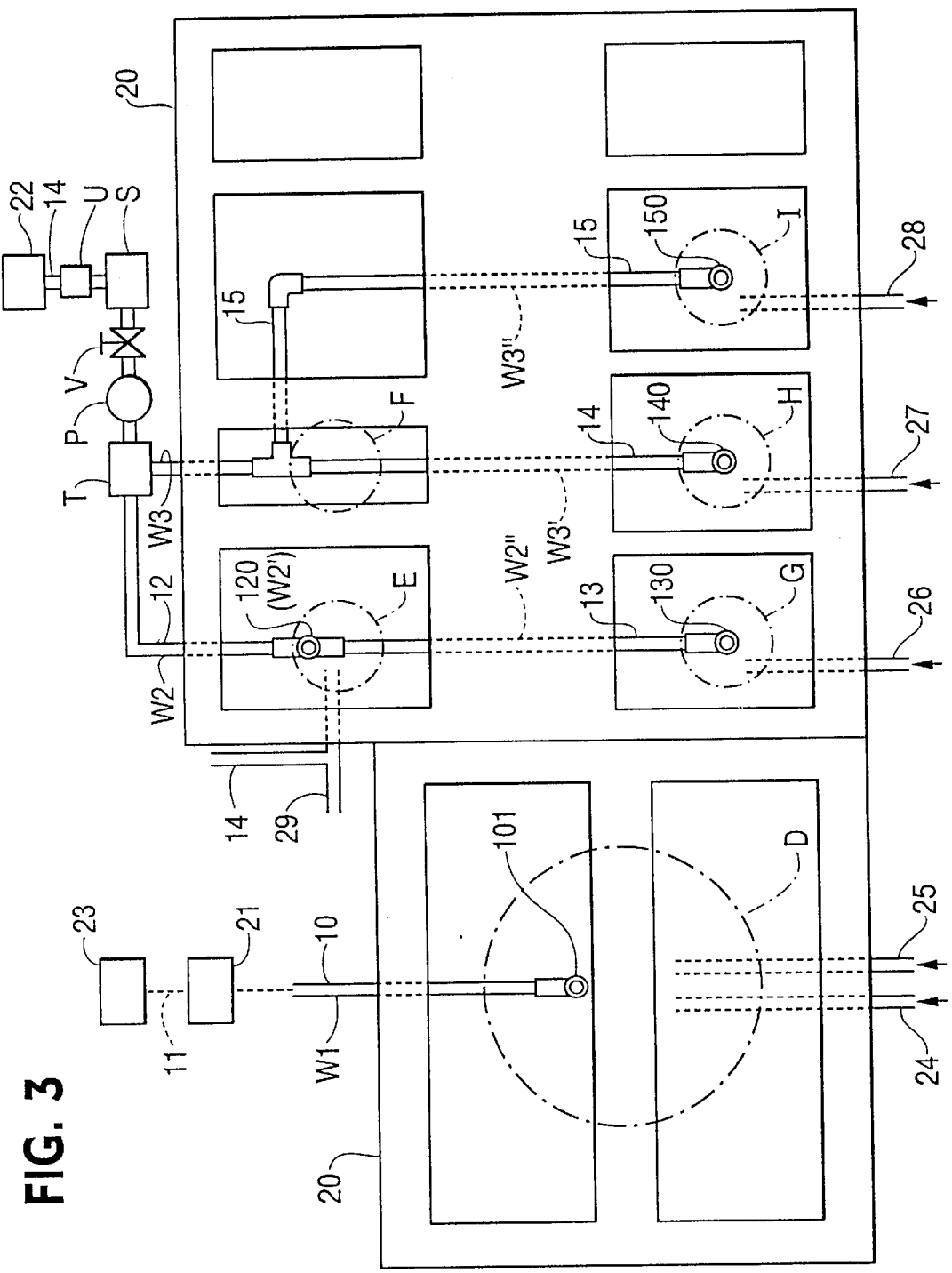
FIG. 3 is a plan view showing a base and drainage pipes provided in parts of the base according to another embodiment of the present invention.

In the embodiment shown in FIG. 3, all the waste liquids W2 and W3 discharged from cleaning apparatus 20 are treated by a system which includes a tank T, a pump P, a flow control valve, a filter S and an ion-exchange separation device U so that the entire amount of the pure water used in operation of the polishing apparatus 30 is prepared from the waste liquid of the cleaning apparatus.

What is claimed is:

1. A polishing plant, comprising:
    a polishing apparatus for polishing a surface of a workpiece to be polished, during which polishing a first waste liquid is generated and discharged from said polishing apparatus;
    a cleaning apparatus including at least one cleaning machine for cleaning a workpiece polished by said polishing apparatus, during which cleaning at least one second waste liquid is generated and discharged from said cleaning apparatus;
    a supply pipe for supplying a liquid to be used in said polishing plant; and
    a drainage pipe line communicating said cleaning apparatus with said supply pipe for supplying and reusing the second waste liquid in said polishing plant.

2. A polishing plant according to claim 1, and further comprising a filter for removal of particles in the second waste liquid.

3. A polishing plant according to claim 1, and further comprising an ion-exchange separation device for removing ionic impurities in the second waste liquid.

4. A polishing plant comprising:
    a polishing apparatus for polishing a surface of a workpiece to be polished, said polishing apparatus generating and discharging a first waste liquid during polishing;
    a cleaning apparatus comprising a plurality of machines including at least one cleaning machine for cleaning a workpiece polished by said polishing apparatus, said cleaning apparatus at least one of said machines of generating at least one second waste liquid; and
    a plurality of drainage pipes, each of said plurality of drainage pipes passing one of the first and at least one second waste liquids;
    wherein one of said plurality of drainage pipes passing at least one second waste liquid generated by said at least one of said machines is connected to a supply pipe for supplying a liquid to a point of use in said polishing plant other than the machine or machines of said cleaning apparatus from which the at least one second waste liquid was generated;
    wherein waste liquid that has passed through said one of said plurality of drainage pipes is reused in said polishing plant and an other waste liquid that has passed through another of said plurality of drainage pipes is not reused in said polishing plant.

5. The polishing plant of claim 4, wherein said point of use comprises said polishing apparatus.

6. The polishing plant of claim 4, and further comprising a filter for removal of particles in said one of said plurality of drainage pipes.

7. The polishing plant of claim 4, and further comprising an ion-exchange separation device for removing ionic impurities in said one of said plurality of drainage pipes.

8. A polishing plant for polishing a semiconductor wafer, comprising:
    a polishing apparatus for polishing a surface of a semiconductor wafer to be polished and comprising a first drainage pipe line receiving a first waste liquid generated and discharged from said polishing apparatus during polishing of a semiconductor wafer;
    a cleaning apparatus comprising a plurality of machines including at least one cleaning machine for cleaning a semiconductor wafer polished by said polishing apparatus, during which cleaning at least one second waste liquid is generated and discharged from said plurality of machines of said cleaning apparatus; and
    a second drainage pipe line receiving the at least one second waste liquid from said cleaning apparatus and connected to a supply pipe for supplying a liquid to a point of use in said polishing plant other than the machine or machines of said cleaning apparatus from which the at least one second waste liquid was generated to supply and reuse the second waste liquid in said polishing plant.

* * * * *

UNITED STATES PATENT AND TRADEMARK OFFICE
CERTIFICATE OF CORRECTION

PATENT NO.    : 6,428,400 B1
DATED         : August 6, 2002
INVENTOR(S)   : Tetsuji Togawa et al.

It is certified that error appears in the above-identified patent and that said Letters Patent is hereby corrected as shown below:

Ttile page,
Item [63], Related U.S. Application Data, should read as follows: -- Continuation of application No. 08/969,738 filed on November 13, 1997, now Patent No. 6,116,986. --

Signed and Sealed this

Thirty-first Day of December, 2002

JAMES E. ROGAN
*Director of the United States Patent and Trademark Office*